(12) United States Patent
Essar et al.

(10) Patent No.: US 12,136,615 B2
(45) Date of Patent: Nov. 5, 2024

(54) ELECTRONIC PACKAGE WITH INTERPOSER BETWEEN INTEGRATED CIRCUIT DIES

(71) Applicant: Qorvo US, Inc., Greensboro, NC (US)

(72) Inventors: Matthew Essar, Wylie, TX (US); Curtis Miller, Wylie, TX (US); Christopher Sanabria, Richardson, TX (US); Zhunming Du, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 379 days.

(21) Appl. No.: 17/538,517

(22) Filed: Nov. 30, 2021

(65) Prior Publication Data

US 2023/0170340 A1    Jun. 1, 2023

(51) Int. Cl.
*H01L 25/16*        (2023.01)
*H01L 23/00*        (2006.01)
(Continued)

(52) U.S. Cl.
CPC .......... *H01L 25/165* (2013.01); *H01L 23/043* (2013.01); *H01L 23/492* (2013.01);
(Continued)

(58) Field of Classification Search
CPC . H01L 23/49822; H01L 23/04; H01L 23/642; H01L 24/32; H01L 23/66; H01L 23/047; H01L 23/043; H01L 24/83; H01L 23/492; H01L 24/29; H01L 25/165; H01L 24/33; H01L 24/48; H01L 23/057; H01L 23/36; H01L 24/49; H01L 25/0655; H01L 23/552; H01L 23/5387; H01L 25/105; H01L 23/562; H01L 29/66977; H01L 25/0652; H01L 23/5384; H01L 29/66439; H01L 21/4857; H01L 25/18; H01L 25/16; H01L 23/5383; H01L 23/5385; H01L 21/486; H01L 23/13; H01L 25/50;
(Continued)

(56) References Cited

U.S. PATENT DOCUMENTS 5,736,783 A    4/1998  Wein et al.
5,773,879 A    6/1998  Fusayasu et al.
(Continued)

OTHER PUBLICATIONS

Non-Final Office Action for U.S. Appl. No. 14/589,464, mailed Nov. 18, 2016, 16 pages.
(Continued)

*Primary Examiner* — Mouloucoulaye Inoussa
(74) *Attorney, Agent, or Firm* — Withrow & Terranova, P.L.L.C.

(57) ABSTRACT

The disclosure is directed to an electronic package with an interposer between integrated circuit dies. At least one inner capacitor (e.g., single layer capacitor) is mounted to the interposer. The electronic package further includes an input passive circuit substrate and an output passive circuit substrate mechanically coupled to the metal base. Use of an interposer to be simultaneously solder attached with integrated circuit dies provides a configuration that improves linearity performance and/or wide video bandwidth of the electronic package (e.g., packages that use epoxy and laminate interposers). Further, such configuration facilitates efficient manufacturing of the electronic package at high volumes.

20 Claims, 9 Drawing Sheets

(51) Int. Cl.

| | |
|---|---|
| *H01L 23/043* | (2006.01) |
| *H01L 23/492* | (2006.01) |
| *H01L 23/498* | (2006.01) |
| *H01L 23/64* | (2006.01) |
| *H01L 23/66* | (2006.01) |

(52) U.S. Cl.
CPC ...... *H01L 23/49822* (2013.01); *H01L 23/642* (2013.01); *H01L 23/66* (2013.01); *H01L 24/29* (2013.01); *H01L 24/32* (2013.01); *H01L 24/48* (2013.01); *H01L 24/83* (2013.01); *H01L 2223/6683* (2013.01); *H01L 2224/29111* (2013.01); *H01L 2224/29144* (2013.01); *H01L 2224/32245* (2013.01); *H01L 2224/48195* (2013.01); *H01L 2224/83801* (2013.01)

(58) Field of Classification Search
CPC ......... H01L 23/49816; H01L 23/49838; H01L 23/535; H01L 23/49866; H01L 25/0657; H01L 23/5226; H01L 23/3736; H01L 23/5283; H01L 23/53209; H01L 23/481; H01L 23/49827; H01L 23/53238; H01L 27/0688; H01L 2223/6683; H01L 2224/32245; H01L 2224/29144; H01L 2223/6644; H01L 2223/6655; H01L 2224/83801; H01L 2223/6611; H01L 2224/29111; H01L 2224/48195; H01L 2224/1403; H01L 2224/16145; H01L 2224/16225; H01L 2225/06513; H01L 2225/06541; H01L 2225/06524; H01L 2225/06527; H01L 2225/06572; H01L 2225/06555; H01L 2225/06548; H01L 2225/06517; H05K 9/0026; H05K 9/0064; H05K 1/189; H05K 1/023; H05K 9/0071; H05K 2201/0707; G06F 1/1684; G06F 1/1643; G06F 3/044; G06F 1/182; G06F 1/1656; G06F 2203/04107; H04M 1/026; H04M 1/0277; H04M 2250/22; H10N 60/805; H10N 60/0744; H10N 69/00; G06N 10/00; B82Y 10/00

See application file for complete search history.

(56) References Cited

U.S. PATENT DOCUMENTS

| | | | |
|---|---|---|---|
| 6,511,866 B1 | 1/2003 | Bregante et al. | |
| 10,015,882 B1 | 7/2018 | Murdock et al. | |
| 11,145,579 B1* | 10/2021 | Kinzer | H01L 23/49575 |
| 11,775,119 B1* | 10/2023 | Song | H01L 25/0655 |
| | | | 361/749 |
| 2002/0096767 A1 | 7/2002 | Cote et al. | |
| 2009/0033337 A1* | 2/2009 | Pasco | G01R 1/0416 |
| | | | 324/555 |
| 2011/0042795 A1* | 2/2011 | Knickerbocker | |
| | | | H01L 23/49827 |
| | | | 257/E21.585 |
| 2012/0092218 A1* | 4/2012 | Akasegawa | H01L 23/49822 |
| | | | 361/783 |
| 2012/0241980 A1* | 9/2012 | Ko | H01L 25/03 |
| | | | 257/E21.705 |
| 2015/0103491 A1 | 4/2015 | Ma | |
| 2015/0155256 A1* | 6/2015 | Lin | H01L 23/552 |
| | | | 257/737 |
| 2015/0156910 A1 | 6/2015 | Zhu et al. | |
| 2016/0071818 A1* | 3/2016 | Wang | H01L 24/49 |
| | | | 257/773 |
| 2017/0033038 A1* | 2/2017 | Nakagawa | H01L 25/00 |
| 2017/0092621 A1* | 3/2017 | Das | H01L 25/50 |
| 2018/0013052 A1* | 1/2018 | Oliver | G06N 10/00 |
| 2018/0212122 A1* | 7/2018 | Lee | H01L 33/64 |
| 2019/0051615 A1 | 2/2019 | Nair et al. | |
| 2019/0348340 A1* | 11/2019 | Kwon | H01L 23/3675 |
| 2019/0363157 A1* | 11/2019 | Karashima | H01L 24/17 |
| 2020/0006252 A1* | 1/2020 | Yu | H01L 21/6835 |
| 2020/0235083 A1* | 7/2020 | Kwon | H01L 23/5385 |
| 2020/0357767 A1* | 11/2020 | Sato | H01L 24/02 |
| 2020/0364600 A1* | 11/2020 | Elsherbini | H10N 60/805 |
| 2021/0036059 A1* | 2/2021 | Leng | H01L 23/645 |
| 2021/0135639 A1 | 5/2021 | Jones et al. | |
| 2021/0151549 A1* | 5/2021 | Zou | H01L 23/5226 |
| 2021/0193562 A1* | 6/2021 | Lee | H01L 21/486 |
| 2021/0217722 A1 | 7/2021 | Kodama | |
| 2021/0305170 A1* | 9/2021 | Chuang | H01L 21/565 |
| 2021/0311517 A1* | 10/2021 | Srinivasan | G05F 1/575 |
| 2021/0343684 A1* | 11/2021 | Kim | H01L 24/13 |
| 2021/0366789 A1* | 11/2021 | Knickerbocker | G01R 31/2884 |
| 2021/0366802 A1* | 11/2021 | Huang | H01L 25/167 |
| 2021/0373285 A1* | 12/2021 | Peng | G02B 1/041 |
| 2022/0003948 A1* | 1/2022 | Zhou | G02B 6/4279 |
| 2022/0068821 A1* | 3/2022 | Cheah | H01L 21/486 |
| 2022/0068833 A1* | 3/2022 | Lim | H01L 23/552 |
| 2022/0190849 A1* | 6/2022 | Shinozaki | H01L 23/12 |
| 2022/0278035 A1* | 9/2022 | Otani | H01L 23/49827 |
| 2022/0278058 A1* | 9/2022 | Kuo | H01L 24/92 |
| 2022/0278087 A1* | 9/2022 | Wu | H01L 25/50 |
| 2022/0282841 A1* | 9/2022 | Higashiyama | H01L 33/486 |
| 2022/0359421 A1* | 11/2022 | Chuang | H01L 21/56 |
| 2023/0049283 A1* | 2/2023 | Suk | H01L 24/19 |
| 2023/0197629 A1* | 6/2023 | Du | H01L 23/66 |
| | | | 257/659 |
| 2023/0290714 A1* | 9/2023 | Hsieh | H01L 23/3128 |

OTHER PUBLICATIONS

Final Office Action for U.S. Appl. No. 14/589,464, mailed Mar. 9, 2017, 12 pages.
Non-Final Office Action for U.S. Appl. No. 14/589,464, mailed Jul. 6, 2017, 16 pages.
Final Office Action for U.S. Appl. No. 14/589,464, mailed Oct. 23, 2017, 14 pages.
Notice of Allowance for U.S. Appl. No. 14/589,464, mailed Mar. 9, 2018, 10 pages.
Notice of Allowance for U.S. Appl. No. 17/388,499, mailed Feb. 17, 2023, 9 pages.
Extended European Search Report for European Patent Application No. 22207878.4, mailed Jun. 12, 2023, 5 pages.
Examination Report for European Patent Application No. 22207878.4, mailed May 27, 2024, 5 pages.

* cited by examiner

ELECTRONIC PACKAGE WITH INTERPOSER BETWEEN INTEGRATED CIRCUIT DIES

FIELD OF THE DISCLOSURE

The present invention relates to packaging of integrated circuits (ICs). In particular, the present invention relates to an electronic package with an interposer between integrated circuit dies.

BACKGROUND

Wireless communication demands often require higher operating frequencies, increased operating power, wider operating and video bandwidths, and/or higher order modulation schemes, etc. The power amplifier is a significant integrated circuit (IC) in these systems. The simultaneous need for more bandwidth, output power, and linearity of the power amplifier are competing requirements. In addition, packaging plays a crucial role in the power amplifier meeting these requirements. For example, performance may be affected by bond wire length depending on placement of capacitors relative to an IC.

SUMMARY

Embodiments of the disclosure are directed to an electronic package with an interposer between integrated circuit dies. At least one inner capacitor (e.g., single layer capacitor) is mounted to the interposer. The electronic package further includes an input passive circuit substrate and an output passive circuit substrate mechanically coupled to the metal base. Use of an interposer to be simultaneously solder attached with integrated circuit dies provides a configuration that improves linearity performance and/or wide video bandwidth of the electronic package (e.g., packages that use epoxy and laminate interposers). Further, such configuration facilitates efficient manufacturing of the electronic package at high volumes.

One embodiment of the disclosure relates to an electronic package. The electronic package includes a metal base, solder coupled to the metal base, a first integrated circuit die coupled to the metal base by the solder, a second integrated circuit die coupled to the metal base by the solder, and an interposer coupled to the metal base by the solder. The interposer is positioned between the first integrated circuit die and the second integrated circuit die. The electronic package further includes at least one inner capacitor mounted to the interposer. The electronic package further includes an input passive circuit substrate mechanically coupled to the metal base, and an output passive circuit substrate mechanically coupled to the metal base. At least a portion of the first integrated circuit die, the second integrated circuit die, and the interposer are positioned between the input passive circuit substrate and the output passive circuit substrate.

Another embodiment of the disclosure relates to a method of manufacturing an electronic package. The method includes applying solder to a metal base. The method further includes positioning a first integrated circuit die, a second integrated circuit die, and an interposer on the solder. The interposer is positioned between the first integrated circuit die and the second integrated circuit die. The interposer includes at least one inner capacitor. The method further includes coupling an input passive circuit substrate and an output passive circuit substrate to the metal base. At least a portion of the first integrated circuit die, the second integrated circuit die, and the interposer are positioned between the input passive circuit substrate and the output passive circuit substrate. The method further includes heating the solder to couple the first integrated circuit die, the second integrated circuit die, and the interposer to the metal base.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element, and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments of the disclosure are directed to an electronic package with an interposer between integrated circuit dies. At least one inner capacitor (e.g., single layer capacitor) is mounted to the interposer. The electronic package further includes an input passive circuit substrate and an output passive circuit substrate mechanically coupled to the metal base. Use of an interposer to be simultaneously solder attached with integrated circuit dies provides a configuration that improves linearity performance and/or wide video bandwidth of the electronic package (e.g., packages that use epoxy and laminate interposers). Further, such configuration facilitates efficient manufacturing of the electronic package at high volumes.

Figure 1A:
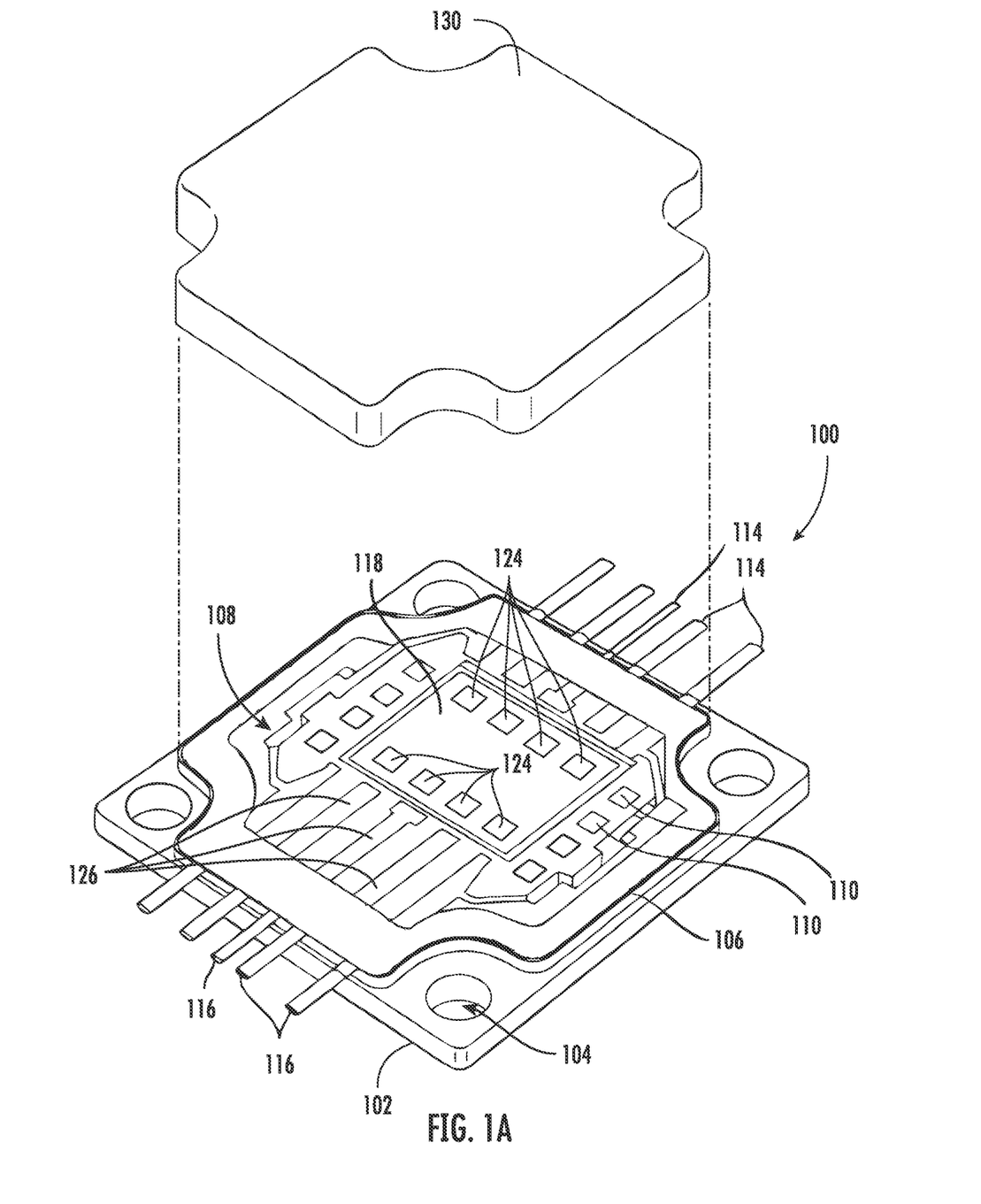
FIG. 1A is a top perspective exploded view of an electronic package (e.g., electronic package).
Figure 1B:
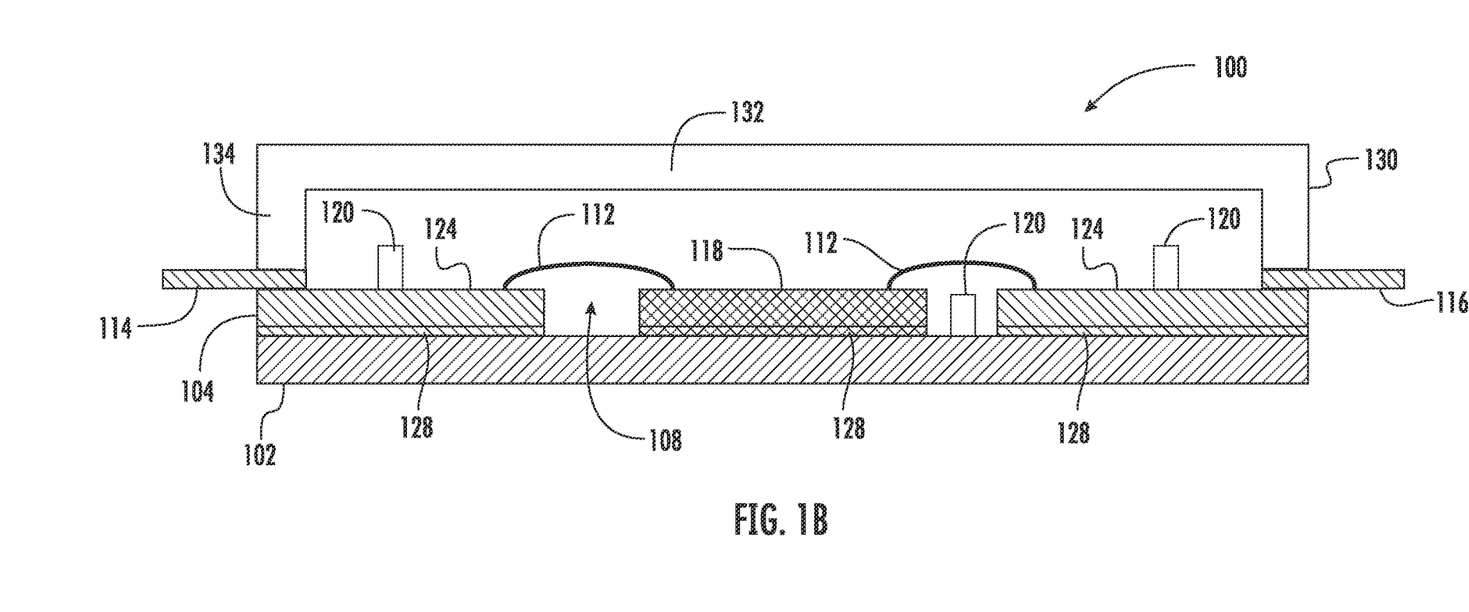
FIG. 1B is a cross-sectional side view of the electronic package of FIG. 1A.
Figure 2A:
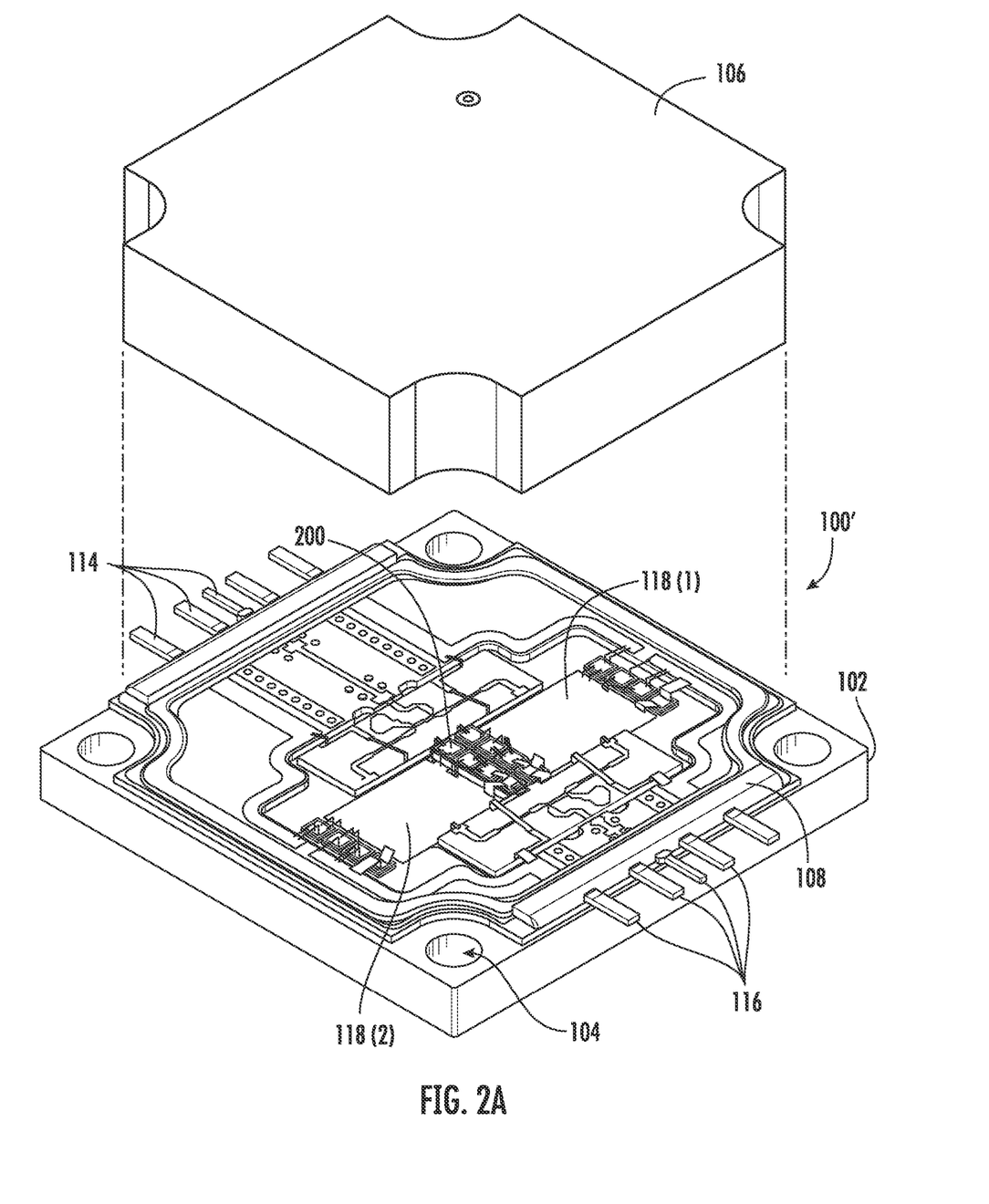
FIG. 2A is an exploded view of an electronic package with an interposer positioned between two integrated circuit dies.
Figure 2B:
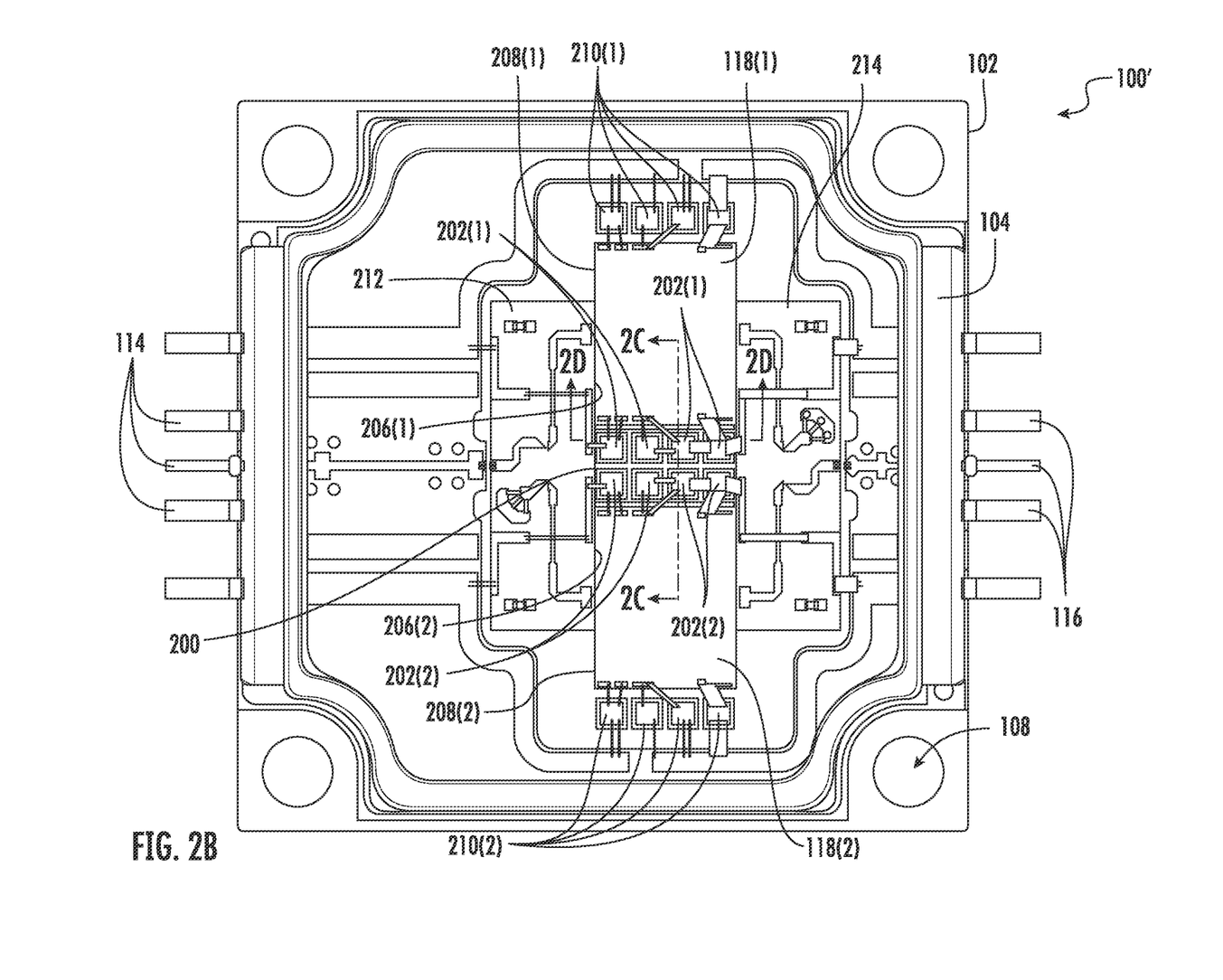
FIG. 2B is a top view of the electronic package of FIG. 2A.
Figure 2C:
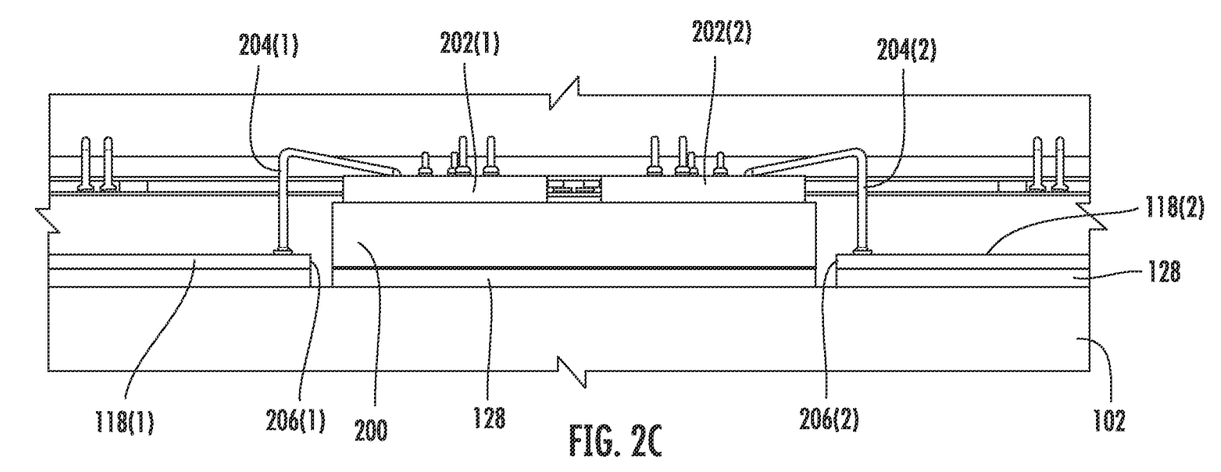
FIG. 2C is a cross-sectional side view of a portion of the electronic package of FIG. 2A.
Figure 2D:
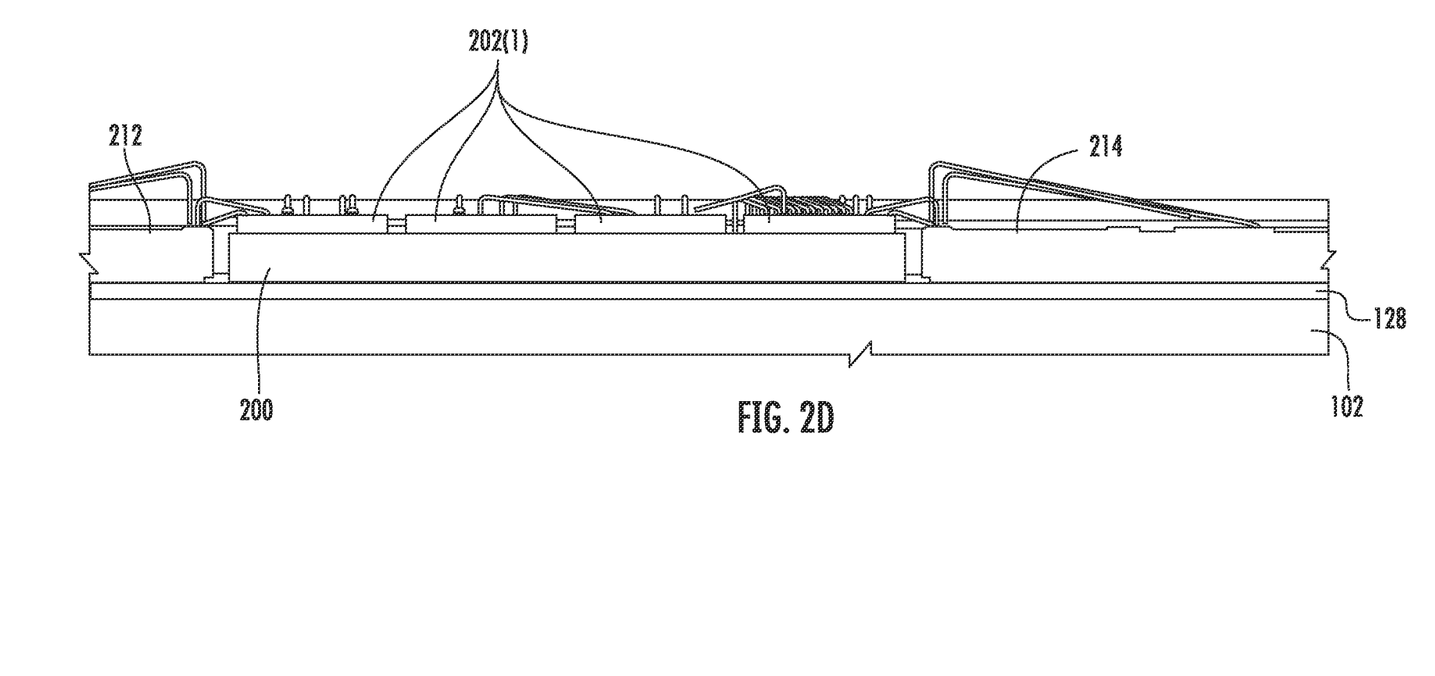
FIG. 2D is a cross-sectional side view of another portion of the electronic package of FIG. 2A.

Before delving into specific details of various aspects of the present disclosure, an overview of various elements that may be included in exemplary electronic packages of the present disclosure is provided. In particular, FIGS. 1A-1B are views of an electronic package 100 (may also be referred to as a semiconductor package 100).

The electronic package 100 may include a carrier 102 (may also be referred to as a base). In certain embodiments, the carrier 102 may be sufficiently rigid so as to prevent undesired flexing of any components coupled thereto. Additionally, the carrier 102 may include a plurality of holes 104 suitable for receiving a fastening means, such as screws or pins. The holes 104 may allow the electronic package 100 to be affixed to a host device or system, such as a radio frequency (RF) system. The carrier 102 may be formed from electrically conductive materials, thermally conductive materials, or non-conductive materials. In certain embodiments, the carrier 102 may include metal, metal alloy, ceramic, diamond, copper, tungsten, tungsten-copper (W—Cu), and/or copper-molybdenum-copper (Cu—Mo—Cu). In other embodiments, the carrier 102 may be plated, such as with a conductive material (e.g., gold).

The electronic package 100 may include a ring structure 106 (may also be referred to as a signal carrying component, ring frame, etc.), which may be a printed circuit board (PCB), laminate, substrate, printed wiring board, flexible circuit, dielectric (e.g., soft dielectric), and/or or another similar component comprising conductive pathways. The ring structure 106 may be coupled to the carrier 102, such as by an adhesive material (e.g., epoxy), soldering, pressure bonding, and/or temperature bonding. In certain embodiments, an adhesive material used to attach the ring structure 106 to the carrier 102 may be conductive, such as a conductive epoxy preform.

The ring structure 106 has an opening 108 therethrough. In certain embodiments, the ring structure 106 may have a plurality of outer pads 110, which may be made of a conductive material (e.g., copper). The outer pads 110 may be adapted to have one or more components (e.g., active and/or passive components) and/or leads attached thereto (e.g., via soldering). Interconnects 112 may be attached to outer pads 110 of the ring structure 106, such as through conventional ribbon or wire bonding techniques.

The electronic package 100 may include one or more leads 114, 116. In some embodiments, the ring structure 106 may be coupled to one or more leads 114, 116 that carry a signal through the electronic package 100. The electronic package 100 may include input-side leads 114 located at a first side (e.g., input side) of the electronic package 100 (e.g., to receive RF input signals). Output-side leads 116 are leads located at a second side (e.g., output side) of the electronic package 100, on which the electronic package 100 may provide output signals to an external circuitry/system. Each of the input-side leads 114 and/or output-side leads 116 may be formed of a metal or metal alloy, such as copper. The plurality of leads 114, 116 may be tuned, positioned, and/or of different sizes to perform different signal carrying and/or routing functions. Other embodiments may have leads on the top and bottom of the package as well.

The electronic package 100 may include one or more dies 118 and/or one or more electronic components 120 attached to the carrier 102 and disposed in the opening 108 of the ring structure 106, such that the ring structure 106 surrounds the at least one die 118 and/or electronic components 120. The die 118 and/or the electronic components 120 may be mechanically coupled to the carrier 102 via solder 128 (e.g., gold-tin, or other alloys) and/or another die attach.

The ring structure 106 may be electrically coupled to the die 118 through the interconnects 112. The die 118 may have a functional circuit fabricated thereon. The die 118 may include gallium arsenide (GaAs), gallium nitride (GaN), etc. The die 118 may be attached using any suitable material, such as gold-tin (AuSn) or another alloy. In certain embodiments, the die 118 includes die pads 124 on a top surface of the die 118, each of which is connected to a corresponding connecting trace 126 via an interconnect 112, such as a wire or a ribbon bond. The connecting traces 126 and the die pads 124 may be formed of any suitably conductive material, such as copper.

The one or more electronic components 120 may be attached directly to the carrier 102, and/or attached to the ring structure 106. The one or more electronic components 120 may include active components (e.g., transistors, diodes, and the like) and/or passive components (e.g., resistors, capacitors, inductors, transformers, and the like). The one or more of the electronic components 120 may be electrically coupled to the ring structure 106 via one or more of the interconnects 112.

A lid 130 may have a top wall 132 and a plurality of sidewalls 134 attached to the ring structure 106. Thus, the carrier 102, the ring structure 106, the input-side leads 114, the output-side leads 116, and the lid 130 may enclose the die 118 and the electronic components 120 in the electronic package 100. The lid 130 may be formed from plastic, a plastic composite material, metal, metal alloy, and/or ceramic, etc. The lid 130 may be coupled to a top surface of the ring structure 106 (e.g., a surface opposite the surface of the ring structure 106 that is coupled to the carrier 102), such as by an adhesive material (e.g., epoxy, resin, acrylic, and/or silicone). In certain embodiments, the adhesive material used to attach the lid 130 to the ring structure 106 may be non-conductive. As part of the enclosure provided by the electronic package 100, a seal ring may be formed, for example, to protect elements (e.g., a die, active components, and/or passive components) sealed in by the combination of the carrier 102, the ring structure 106, and the lid 130.

FIGS. 2A-2D are views of an electronic package 100' with an interposer 200 (e.g., solder compatible) positioned between two semiconductor dies 118(1), 118(2) (e.g., solder compatible). In particular, in certain embodiments, the electronic package 100' is a radio frequency (RF) package to handle RF power. The electronic package 100' includes a metal base 102 and solder 128 coupled to the metal base 102. The solder 128 may include one or more solder sheets, which are thin layers of solder, and may be separated from one another. The solder 128 may be placed at specific locations on the metal base 102 to mechanically, electrically, and/or thermally couple one or more electronic components 120 to the metal base 102. In certain embodiments, the solder 128 includes gold-tin. In certain embodiments, the solder 128 consists only of gold-tin.

The electronic package 100' includes a first integrated circuit die 118(1) and a second integrated circuit die 118(2) coupled to the metal base by the solder 128. In certain embodiments, the first integrated circuit die 118(1) and/or the second integrated circuit die 118(2) include a monolithic microwave integrated circuit (MMIC), which may have a thickness between 50 μm and 100 μm. In certain embodiments, the first integrated circuit die 118(1) and the second integrated circuit die 118(2) are attached by gold-tin (AuSn) vacuum reflow, which is used to handle the high thermal temperatures of the integrated circuit dies 118(1), 118(2) (e.g., GaN dies), and/or so the die attach of the electronic package 100' withstands temperature cycle qualification.

The interposer 200 is coupled to the metal base 102 by the solder 128. In particular, the interposer 200 may be coupled to the metal base 102 during the same assembly step as the integrated circuit dies 118(1), 118(2), and with minimized space between the interposer 200 and the integrated circuit dies 118(1), 118(2). For example, the interposer 200 may contact one or both of the integrated circuit dies 118(1), 118(2), or only have small gaps due to mechanical tolerances. The interposer 200 is positioned between the first integrated circuit die 118(1) and the second integrated circuit die 118(2). The interposer 200 is an electrical interface routing between electronic components (e.g., capacitors and the integrated circuit dies 118(1), 118(2)).

Inner capacitors 202(1), 202(2) (e.g., single layer capacitors) are mounted on the interposer 200. In particular, a first set of inner capacitors 202(1) are electrically coupled to the first integrated circuit die 118(1) by bond wires 204(1). Similarly, a second set of inner capacitors 202(2) are electrically coupled to the second integrated circuit die 118(2) by bond wires 204(2). In certain embodiments, the first bond wires 204(1) and/or the second bond wires 204(2) are less than 20 mm long. Generally, the first set of inner capacitors 202(1) are positioned in a row along an inner edge 206(1) of the first integrated circuit die 118(1), and the second set of inner capacitors 202(2) are positioned in a row along an inner edge 206(2) of the second integrated circuit die 118(2). Such a configuration decreases electrical distances between the inner capacitors 202(1), 202(2) and the respective integrated circuit dies 118(1), 118(2) which improves performance of the electronic package 100'. Comparatively, for example, positioning of the inner capacitors 202(1), 202(2) adjacent to an input edge 208(1), 208(2) of the respective integrated circuit dies 118(1), 118(2) increases an electrical distance as the bond wires of the inner capacitors 202(1), 202(2) must extend across the inner edge 206(1), 206(2) of the integrated circuit dies 118(1), 118(2), which negatively affects performance of the electronic package 100'.

Use of the interposer 200 decreases the distance between the inner capacitors 202(1), 202(2) and the respective integrated circuit dies 118(1), 118(2). Compared to other mounting methods, the interposer 200 may be positioned proximate the integrated circuit dies 118(1), 118(2) without negatively affecting performance of the inner capacitors 202(1), 202(2). For example, the interposer 200 may be attached by solder and within about 0.005 inches (e.g., 0.0015) of integrated circuit dies 118(1), 118(2). This nominal spacing is generally considered uncontrolled such that the interposer 200 may even directly contact the first integrated circuit die 118(1) and/or the second integrated circuit die 118(2). Accordingly, such a configuration decreases a bond wire distance of the bond wires 204(1), 204(2) between the inner capacitors 202(1), 202(2) and the integrated circuit dies 118(1), 118(2), thereby improving linearity performance (e.g., intermodulation, adjacent channel power ratio, noise power ratio, etc.) and/or video bandwidth of the electronic package 100'.

Comparatively, for example, if the inner capacitors 202(1), 202(2) were mounted directly to the metal base 102 with epoxy, a greater distance would be required between the inner capacitors 202(1), 202(2) and the respective integrated circuit dies 118(1), 118(2) to prevent the solder 128 of the inner capacitors 202(1), 202(2) from interfering with the solder 128 of the integrated circuit dies 118(1), 118(2).

Outer capacitors 210(1), 210(2) are attached to the metal base 102 by epoxy or solder 128. In particular, a first set of outer capacitors 210(1) are electrically coupled to the first integrated die 118(1) by bond wires 204(1). The first integrated circuit die 118(1) is positioned between the inner capacitors 202(1) and the first outer capacitors 210(1). A second set of outer capacitors 210(2) are electrically coupled to the second integrated die 118(2) by bond wires 204(2). The second integrated circuit die 118(2) is positioned between the inner capacitors 202(2) and the second outer capacitors 210(2).

At least a portion of the inner capacitors 202(1), 202(2) and outer capacitors 210(1), 210(2) include single layer capacitors. Alternatively, standard surface mount device (SMD) capacitors may be used, such as with a laminate PCB material around the integrated circuit dies 118(1), 118(2). However, single layer capacitors (SLC) are generally thinner and have less parasitics than SMD capacitors. Accordingly, in addition to short bond wires 204(1), 204(2), single layer capacitors provide better linearity performance and/or video bandwidth than SMD capacitors.

An input passive circuit substrate 212 (may also be referred to as an input thin film network (TFN)) and an output passive circuit substrate 214 (may also be referred to as an output thin film network (TFN)) are mechanically coupled to the metal base 102. At least a portion of the first integrated circuit die 118(1), the second integrated circuit die 118(2), and the interposer 200 are positioned between the input passive circuit substrate 212 and the output passive circuit substrate 214. In certain embodiments, the electronic package 100' is devoid of solder 128 between the interposer 200 and the first integrated circuit die 118(1), and/or between the interposer 200 and the second integrated circuit die 118(2).

As noted above, such a configuration improves linearity of the electronic package 100', which may be particularly important in the operation of amplifiers. Linearity of amplifiers is often the limiting factor in overall linearity performance of the electronic package 100', and thus the maximum data rate of the electronic package 100'. Linearity may be specified over a frequency pass-band, such as in the MHz range (e.g., video bandwidth (VBW)). For example, an LTE amplifier may have an operating pass-band frequency of 2.4 GHz and the signal going through at 2.4 GHz may have a VBW of 5 MHz. For high performance systems (e.g., satellites, data links), the VBW requirement can be in the GHz range (e.g., 4 GHz). To achieve a wide frequency range of linear performance, electronic components separate from the integrated circuit die become more important (e.g., Base-band termination).

The inner capacitors 202(1), 202(2) and the outer capacitors 210(1), 210(2) adjacent to the integrated circuit dies 118(1), 118(2) suppress digital noise from power supplies and provide base-band termination. Ideal base-band termination is a capacitor with no parasitics (no additional resistance (R), inductance (L), or capacitance (C) other than the intended capacitance of that capacitor) and placed immediately adjacent to the bypassing product. Additional R, L, and C degrade VBW performance of the electronic package 100'. In particular, bypass capacitors wire bonded immediately adjacent to the integrated circuit die 118(1), 118(2) provide improved performance (to reduce length of the bond wires 204(1), 204(2)).

In certain embodiments, the input passive circuit substrate 212, the output passive circuit substrate 214, the laminate ring structure 106, and/or the lid 130 are mechanically coupled to the metal base 102 by adhesive.

Figure 3A:
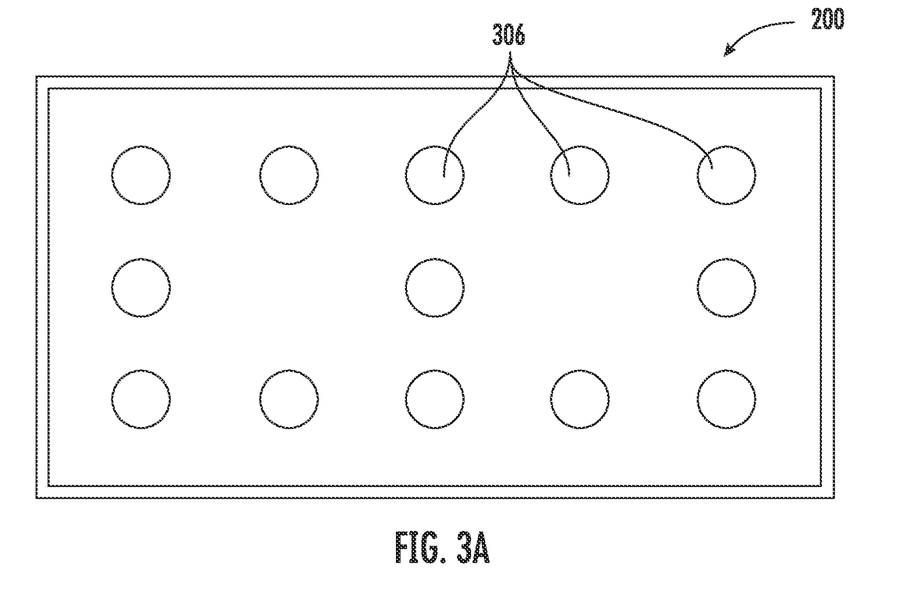
FIG. 3A is a top view of the interposer of FIGS. 2A-2D.
Figure 3B:
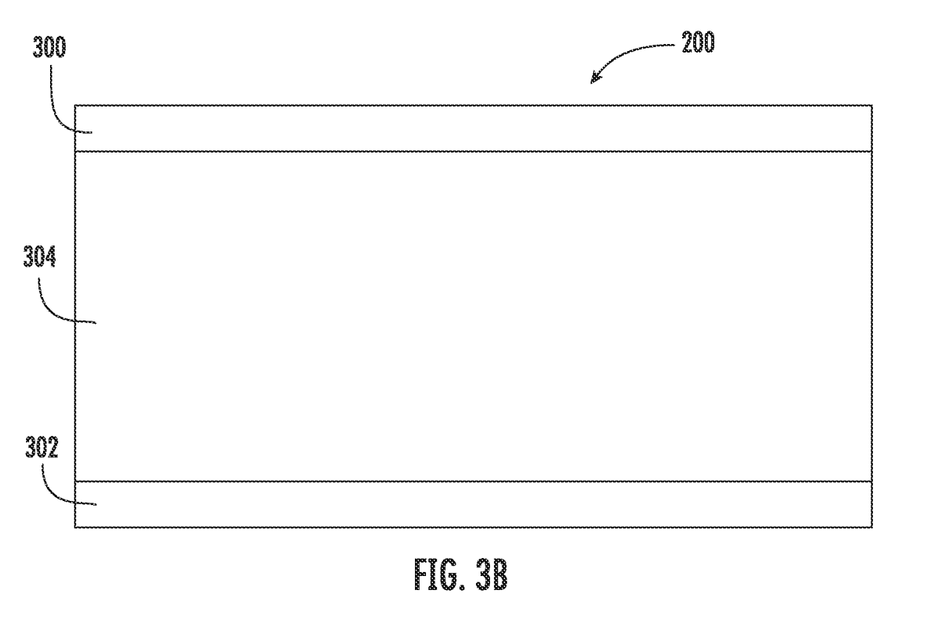
FIG. 3B is a side view of the interposer of FIG. 3A.

FIGS. 3A-3B are views of the interposer 200 of FIGS. 2A-2D. The interposer 200 includes a first conductive layer 300 (may also be referred to as a first plating), a second conductive layer 302 (may also be referred to as a second plating), a dielectric layer 304 positioned between the first conductive layer 300 and the second conductive layer 302, and conductive vias 306 (e.g., metal vias) extending between the first conductive layer 300 and the second conductive layer 302. The conductive vias 306 provide electrical grounding, are compatible with solder attachment (compared with epoxy), and may maximize yield for an assembly housing (e.g., alumina assembly housing). In certain embodiments, the second conductive layer 302 is solder compatible (e.g., AuSn solder).

Figure 4:
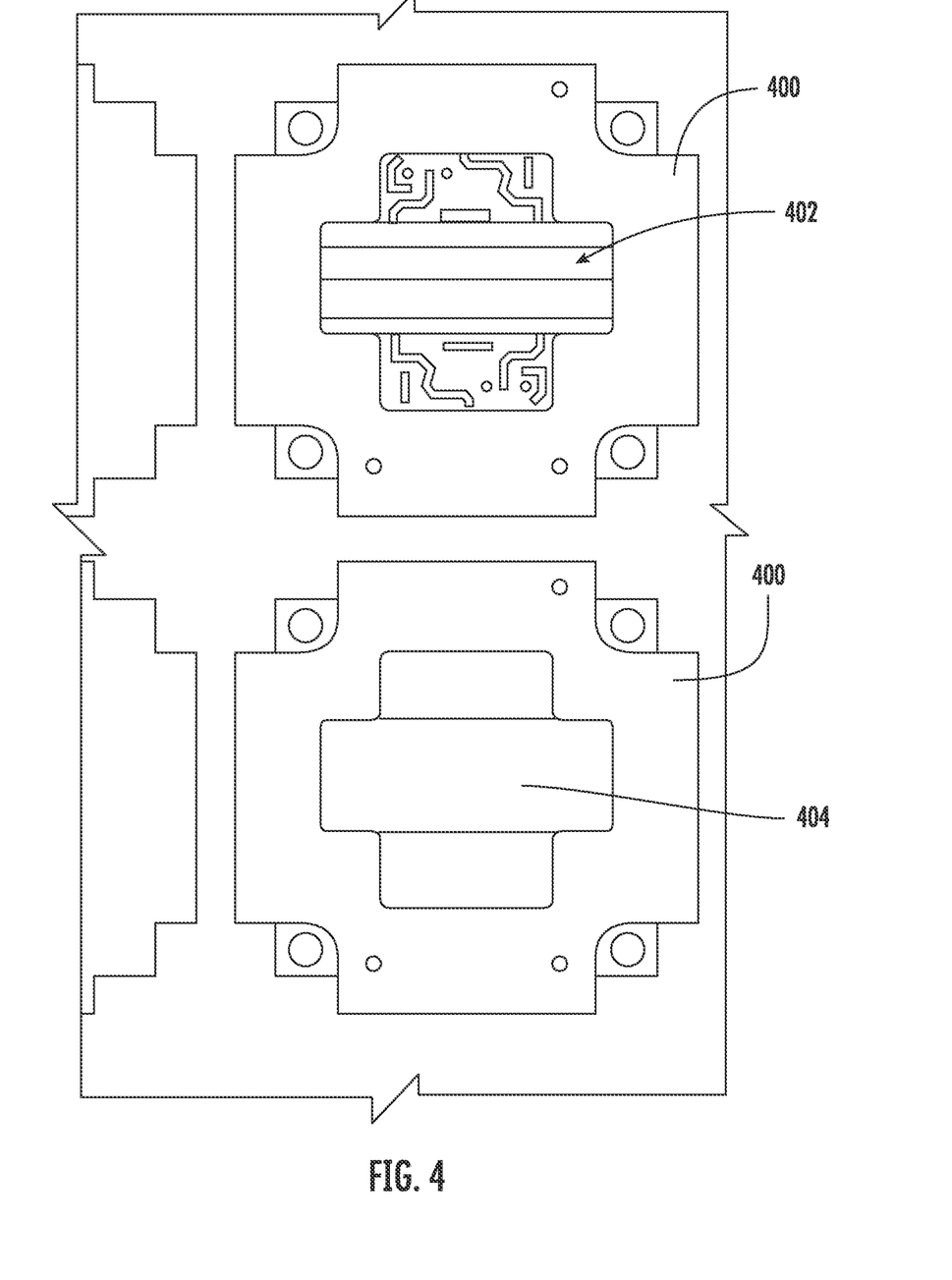
FIG. 4 is a top view of alignment tooling used to manufacture the electronic package of FIGS. 2A-2D.

FIG. 4 is a top view of alignment tooling 400 used to manufacture the electronic package 100' of FIGS. 2A-2D. The alignment tooling 400 defines a cavity 402 to receive the first integrated circuit die 118(1), the second integrated circuit die 118(2), the interposer 200, the input passive circuit substrate 212, and/or the output passive circuit substrate 214, among other electronic components 120. A cover 404 is also provided to cover the cavity 402 and enclose the electronic components 120 therein. The alignment tooling 400 is configured to hold the electronic components 120 in place during solder reflow. The alignment tooling 400 may not be configured to hold the inner capacitors 202(1), 202(2) in place without the interposer 200 due to the small dimensions and tolerances required. Instead, the interposer 200 allows for the first integrated circuit die 118(1), the second integrated circuit die 118(2), the interposer 200, the input passive circuit substrate 212, and/or the output passive circuit substrate 214 to be simultaneously assembled as a single unit during reflow (e.g., AuSn reflow). The outer capacitors 210(1), 210(2) may then be attached (e.g., via epoxy) on the interposer 200. In this way, the space between the distance of the bond wires 204(1), 204(2) is reduced, thereby increasing performance (e.g., RF performance). The interposer 200 (e.g., alumina interposer) prevents the solder (e.g., AuSn) from wicking up the sides of the interposer 200 (e.g., compared to a metal shim).

Figure 5:
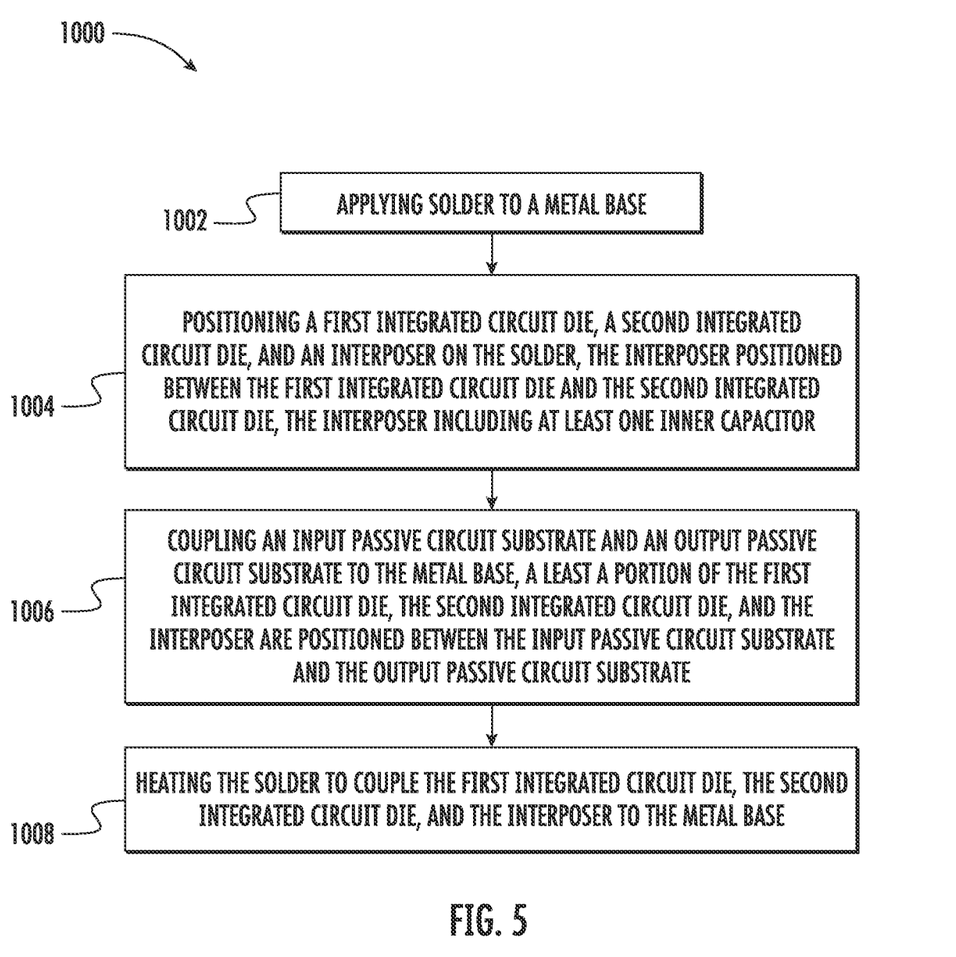
FIG. 5 is a flowchart identifying steps of a method for manufacturing an electronic package of FIGS. 2A-2D.

FIG. 5 is a flowchart 1000 identifying steps of a method for manufacturing an electronic package 100'. The method includes applying solder 128 (e.g., preform, preform pieces, etc.) to a metal base 102 (1002), such as by using alignment tool 400. The method further includes positioning a first integrated circuit die 118(1), a second integrated circuit die 118(2), and an interposer 200 on the solder 128 (1004). The interposer 200 is positioned between the first integrated circuit die 118(1) and the second integrated circuit die 118(2). The interposer 200 includes at least one inner capacitor 202(1), 202(2).

The method further includes coupling an input passive circuit substrate 212 and an output passive circuit substrate 214 to the metal base 102 (1006). At least a portion of the first integrated circuit die 118(1), the second integrated circuit die 118(2), and the interposer 200 are positioned between the input passive circuit substrate 212 and the output passive circuit substrate 214. The method further includes heating the solder 128 to couple the first integrated circuit die 118(1), the second integrated circuit die 118(2), and the interposer 200 to the metal base 102 (1008).

In certain embodiments, the first integrated circuit die 118(1), the second integrated circuit die 118(2), and the interposer 200 are positioned within a cavity 402 of an alignment tool 400.

Those skilled in the art will recognize improvements and modifications to the preferred embodiments of the present disclosure. All such improvements and modifications are considered within the scope of the concepts disclosed herein and the claims that follow.

What is claimed is:

1. An electronic package, comprising:
   a metal base;
   a solder coupled to the metal base;
   a first integrated circuit die coupled to the metal base by the solder, the first integrated circuit die having a first edge at a periphery of the first integrated circuit die that is normal to the metal base;
   a second integrated circuit die coupled to the metal base by the solder, the second integrated circuit die having a second edge at a periphery of the second integrated circuit die that is normal to the metal base;
   an interposer coupled to the metal base by the solder, wherein the interposer defines a third edge at a periphery of the interposer that is normal to the metal base and a fourth edge at the periphery of the interposer that is normal to the metal base and opposite the third edge, the interposer having the third edge and the fourth edge positioned between the first edge of the first integrated circuit die and the second edge of the second integrated circuit die the first integrated circuit die coupled to the metal base by the solder, the first integrated circuit die having the first edge at the periphery of the first integrated circuit die that is normal to the metal base;

at least one inner capacitor mounted to the interposer;

an input passive circuit substrate mechanically coupled to the metal base;

an output passive circuit substrate mechanically coupled to the metal base; and wherein at least a portion of the first integrated circuit die, the second integrated circuit die, and the interposer are positioned between the input passive circuit substrate and the output passive circuit substrate.

2. The electronic package of claim 1, wherein the solder comprises gold-tin.

3. The electronic package of claim 1, wherein the solder consists of gold-tin.

4. The electronic package of claim 1, wherein the solder comprises a solder sheet.

5. The electronic package of claim 1, wherein the solder comprises a plurality of solder sheets separated from each other.

6. The electronic package of claim 1, wherein the first integrated circuit die comprises a first monolithic microwave integrated circuit (MMIC), and the second integrated circuit die comprises a second MMIC.

7. The electronic package of claim 1, wherein the interposer further comprises:
a first conductive layer;
a second conductive layer;
a dielectric layer positioned between the first conductive layer and the second conductive layer; and
at least one conductive via extending between the first conductive layer and the second conductive layer.

8. The electronic package of claim 1, wherein the electronic package is devoid of the solder between:
the interposer and the first integrated circuit die; and
the interposer and the second integrated circuit die.

9. The electronic package of claim 1, wherein the at least one inner capacitor comprises:
a first set of a first plurality of inner capacitors electrically coupled to the first integrated circuit die, and
a second set of a second plurality of inner capacitors electrically coupled to the second integrated circuit die.

10. The electronic package of claim 9,
wherein each of the first plurality of inner capacitors is electrically coupled to the first integrated circuit die by first bond wires;
wherein each of the second plurality of inner capacitors is electrically coupled to the second integrated circuit die by second bond wires; and
wherein the first bond wires and the second bond wires are less than 20 mm long.

11. The electronic package of claim 1, wherein the at least one inner capacitor comprises a single layer capacitor (SLC).

12. The electronic package of claim 1, wherein the input passive circuit substrate and the output passive circuit substrate are mechanically coupled to the metal base by adhesive.

13. The electronic package of claim 1, further comprising:
at least one first outer capacitor proximate the first integrated circuit die, the first integrated circuit die positioned between the at least one inner capacitor and the at least one first outer capacitor; and at least one second outer capacitor proximate the second integrated circuit die, the second integrated circuit die positioned between the at least one inner capacitor and the at least one second outer capacitor.

14. The electronic package of claim 1, further comprising:
a laminate ring structure coupled to the metal base by epoxy; and
a lid coupled to the laminate ring structure by epoxy.

15. A method of manufacturing an electronic package, comprising:
applying a solder to a metal base;
positioning a first integrated circuit die, a second integrated circuit die, and an interposer on the solder, wherein:
the first integrated circuit die has a first edge at a periphery of the first integrated circuit die that is normal to the metal base;
the second integrated circuit die has a second edge at a periphery of the second integrated circuit die that is normal to the metal base, the second edge facing the first edge;
the interposer defines a third edge at a periphery of the interposer that is normal to the metal base and a fourth edge at the periphery of the interposer that is normal to the metal base and opposite the third edge;
the interposer having the third edge and the fourth edge positioned between the first edge of the first integrated circuit die and the second edge of the second integrated circuit die, and at least one inner capacitor mounted to the interposer;
coupling an input passive circuit substrate and an output passive circuit substrate to the metal base, at least a portion of the first integrated circuit die, the second integrated circuit die, and the interposer positioned between the input passive circuit substrate and the output passive circuit substrate; and
heating the solder to couple the first integrated circuit die, the second integrated circuit die, and the interposer to the metal base.

16. The method of claim 15, wherein positioning the first integrated circuit die, the second integrated circuit die, and the interposer comprises:
positioning the first integrated circuit die, the second integrated circuit die, and the interposer within a cavity of an alignment tool.

17. The method of claim 15, wherein the solder comprises gold-tin.

18. The method of claim 15, wherein the interposer further comprises:
a first conductive layer;
a second conductive layer;
a dielectric layer positioned between the first conductive layer and the second conductive layer; and
at least one conductive via extending between the first conductive layer and the second conductive layer.

19. The method of claim 15, wherein, after heating, the electronic package is devoid of the solder between:
the interposer and the first integrated circuit die; and
the interposer and the second integrated circuit die.

20. The method of claim 15, wherein the at least one inner capacitor comprises:
a first set of a first plurality of inner capacitors electrically coupled to the first integrated circuit die; and
a second set of a second plurality of inner capacitors electrically coupled to the second integrated circuit die.

* * * * *